(12) United States Patent
Minekawa et al.

(10) Patent No.: US 7,348,741 B2
(45) Date of Patent: Mar. 25, 2008

(54) METHOD AND DEVICE FOR CONTROLLING FAN FOR COOLING VEHICLE-MOUNTED BATTERY

(75) Inventors: Hideto Minekawa, Toyota (JP); Teruo Ishishita, Aichi-ken (JP); Yoshiaki Kikuchi, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 10/512,948

(22) PCT Filed: Apr. 24, 2003

(86) PCT No.: PCT/JP03/05270

§ 371 (c)(1),
(2), (4) Date: Nov. 1, 2004

(87) PCT Pub. No.: WO03/095260

PCT Pub. Date: Nov. 20, 2003

(65) Prior Publication Data

US 2005/0168180 A1    Aug. 4, 2005

(30) Foreign Application Priority Data

May 14, 2002  (JP) ............................. 2002-138755
Mar. 14, 2003  (JP) ............................. 2003-070202

(51) Int. Cl.
*H02P 3/00*   (2006.01)

(52) U.S. Cl. ...................... 318/268; 318/276; 318/471; 318/376; 62/133; 702/191

(58) Field of Classification Search ................ None
See application file for complete search history.

(56) References Cited

U.S. PATENT DOCUMENTS 5,221,185 A * 6/1993 Pla et al. ...................... 416/34

(Continued)

FOREIGN PATENT DOCUMENTS

DE   10018066 A1 * 10/2001

(Continued)

OTHER PUBLICATIONS

Japanese language version of Office Action, JP 2003-070202, issued Dec. 20, 2005.

(Continued)

*Primary Examiner*—Bentsu Ro
*Assistant Examiner*—Renata McCloud
(74) *Attorney, Agent, or Firm*—Kenyon & Kenyon LLP

(57) ABSTRACT

A vehicle which uses an internal combustion engine and a motor generator as drive sources is provided with a battery disposed under a seat and a fan for cooling the battery. Power is exchanged between the motor generator and battery via an inverter. An electronic control unit estimates the level of background noise which is noise other than the operating sound of the fan in the passenger compartment based on the vehicle speed and rotation speed, etc., of the internal combustion engine. Then, the electronic control unit calculates an operation command value for the fan based on the estimated background noise level and temperature level of the battery and controls the rotation speed of the fan through the operation command value. As a result, it is possible to effectively cool the battery while reducing sensible noise caused by the operating sound of the fan.

19 Claims, 4 Drawing Sheets

U.S. PATENT DOCUMENTS

| | | | |
|---|---|---|---|
| 5,586,065 A * | 12/1996 | Travis | 702/191 |
| 5,898,296 A * | 4/1999 | Maddox et al. | 323/282 |
| 5,937,664 A * | 8/1999 | Matsuno et al. | 62/259.2 |
| 5,950,440 A * | 9/1999 | Niimi et al. | 62/133 |
| 6,137,250 A | 10/2000 | Hirano et al. | 318/376 |
| 6,287,081 B1 * | 9/2001 | Tamegai et al. | 417/15 |
| 6,296,957 B1 * | 10/2001 | Graage | 429/12 |
| 6,320,351 B1 * | 11/2001 | Ng et al. | 320/104 |
| 6,435,158 B1 * | 8/2002 | Mingo et al. | 123/198 D |
| 6,438,487 B1 * | 8/2002 | Mingo et al. | 701/113 |
| 6,441,586 B1 * | 8/2002 | Tate et al. | 320/132 |
| 6,494,286 B2 * | 12/2002 | Shimizu et al. | 180/299 |
| 7,024,871 B2 * | 4/2006 | Zhu et al. | 62/133 |
| 2002/0094469 A1 * | 7/2002 | Yoshizuma et al. | 429/34 |
| 2002/0140389 A1 * | 10/2002 | Ohki et al. | 318/471 |
| 2003/0118891 A1 * | 6/2003 | Saito et al. | 429/62 |
| 2004/0049237 A1 * | 3/2004 | Larson et al. | 607/17 |
| 2004/0247962 A1 * | 12/2004 | Toukura | 429/22 |

FOREIGN PATENT DOCUMENTS

| | | |
|---|---|---|
| JP | 47-25813 | 10/1972 |
| JP | 56-107701 | 8/1981 |
| JP | 57-003587 | 1/1982 |
| JP | 07-073906 | 3/1995 |
| JP | 08-216716 | 8/1996 |
| JP | 10-121968 | 5/1998 |
| JP | 11-285106 | 10/1999 |
| JP | 2000-338994 | 12/2000 |
| JP | 2001-103612 | 4/2001 |
| JP | 2001-233064 | 8/2001 |
| JP | 2002-27602 | 1/2002 |

OTHER PUBLICATIONS

English language version of Office Action, JP 2003-070202, issued Dec. 20, 2005.

* cited by examiner

METHOD AND DEVICE FOR CONTROLLING FAN FOR COOLING VEHICLE-MOUNTED BATTERY

This is a 371 of PCT/JP03/05270 filed 24 Apr. 2003, which claims priority to Japanese Patent Application No. 2002-138755 filed 14 May 2002, and JP 2003-070202 filed 14 Mar. 2003, the contents of which are incorporated herein by reference in their entirety.

FIELD OF THE INVENTION

The present invention relates to a method and apparatus for controlling a vehicle-mounted battery cooling fan.

BACKGROUND OF THE INVENTION

In recent years, electric cars using an electric motor as a drive source and hybrid cars using an electric motor and internal combustion engine as drive sources are attracting attention. These vehicles are normally provided with a chargeable battery and the electric motor is driven by electric energy stored in this battery.

The battery includes internal resistance, and therefore charging/discharging is accompanied by heat generation. For this reason, the temperature of the battery rises as charging/discharging of the battery is repeated.

Furthermore, when such a battery is continuously used under a high-temperature condition, the life is generally shortened. For this reason, to protect the battery, the battery may be controlled so as to limit the charge/discharge current when the battery is under a high-temperature condition. However, in this case, sufficient propulsion may not be obtained or in the case of a hybrid car, poor fuel efficiency of the internal combustion engine may result.

For this reason, the above described vehicle is often provided with a fan for cooling the battery. The rotation speed of the fan is normally high when the battery is under a high temperature condition and slow under a low temperature condition.

On the other hand, in the case of the hybrid car or the electric car, when the car is parked or when the electric motor is used as a drive source, generally noise in the passenger compartment is often kept to a low level. When noise is at a low level in such a passenger compartment, if the fan is operating for cooling the battery, the operating sound of the fan increases relative to background noise in the passenger compartment, that is, noise other than the operating sound of the fan. Since passengers of the vehicle are rarely aware of the reason for the operation of the fan under ordinary circumstances, the passengers feel the operating sound of the fan as offensive to the ear.

Therefore, in order to reduce annoyance by the operating sound of the fan, the fan is stopped when, for example, the vehicle is parked and no operating sound of the internal combustion engine is present. Alternatively, measures such as reducing the rotation speed of the fan are taken. For example, Japanese Laid-Open Patent Publication No. 2001-103612 proposes a fan control apparatus for a hybrid car provided with a function for reducing the rotation speed of the fan before stopping idle operation when stoppage of the idle operation of the internal combustion engine is predicted. As the fan control apparatus disclosed in this publication, the rotation speed of the fan decreases prior to the stoppage of idle operation, and therefore it is possible to reduce annoyance of the passengers caused by the operating sound of the fan while the idle operation is stopped.

However, it is not always possible to determine whether background noise in the passenger compartment, that is, noise other than the operating sound of the fan is relatively small or not based only on whether the idle operation of the internal combustion engine is stopped or not. That is, even if the idle operation is stopped, background noise may be large in the passenger compartment due to sound other than the operating sound of the internal combustion engine. When the rotation speed of the fan continues to be low for a long time though background noise in the passenger compartment is relatively large, the temperature of the battery increases and the life of the battery may be shortened.

In the case of not only a battery for supplying electric energy to a vehicle motor, but also other vehicle-mounted batteries which realize cooling through rotation of the fan, the above described situation in which the operating sound becomes offensive to the ear is generally common.

SUMMARY OF THE INVENTION

It is an objective of the present invention to provide a method and apparatus for controlling a vehicle-mounted battery cooling fan capable of effectively cooling the vehicle-mounted battery while reducing sensible noise due to operating sound of the fan.

In order to achieve the above described object, the present invention provides a method of controlling a fan for cooling a vehicle-mounted battery. The vehicle is provided with a passenger compartment, and an electric motor that functions as a drive source. The control method comprises a step of determining noise level in the passenger compartment and a step of controlling an operation mode of the fan according to the determined noise level in the passenger compartment.

The present invention further provides an apparatus for controlling a fan for cooling a vehicle-mounted battery. The vehicle is provided with a passenger compartment, and an electric motor that functions as a drive source. The control apparatus comprises a determining means for determining noise level in the passenger compartment and controlling means for controlling the operation mode of the fan according to the determined noise level in the passenger compartment.

DETAILED DESCRIPTION OF THE PREFERRED EMBODIMENTS

With reference now to FIG. 1 to FIG. 4, an embodiment of the present invention will be explained below.

Figure 1:
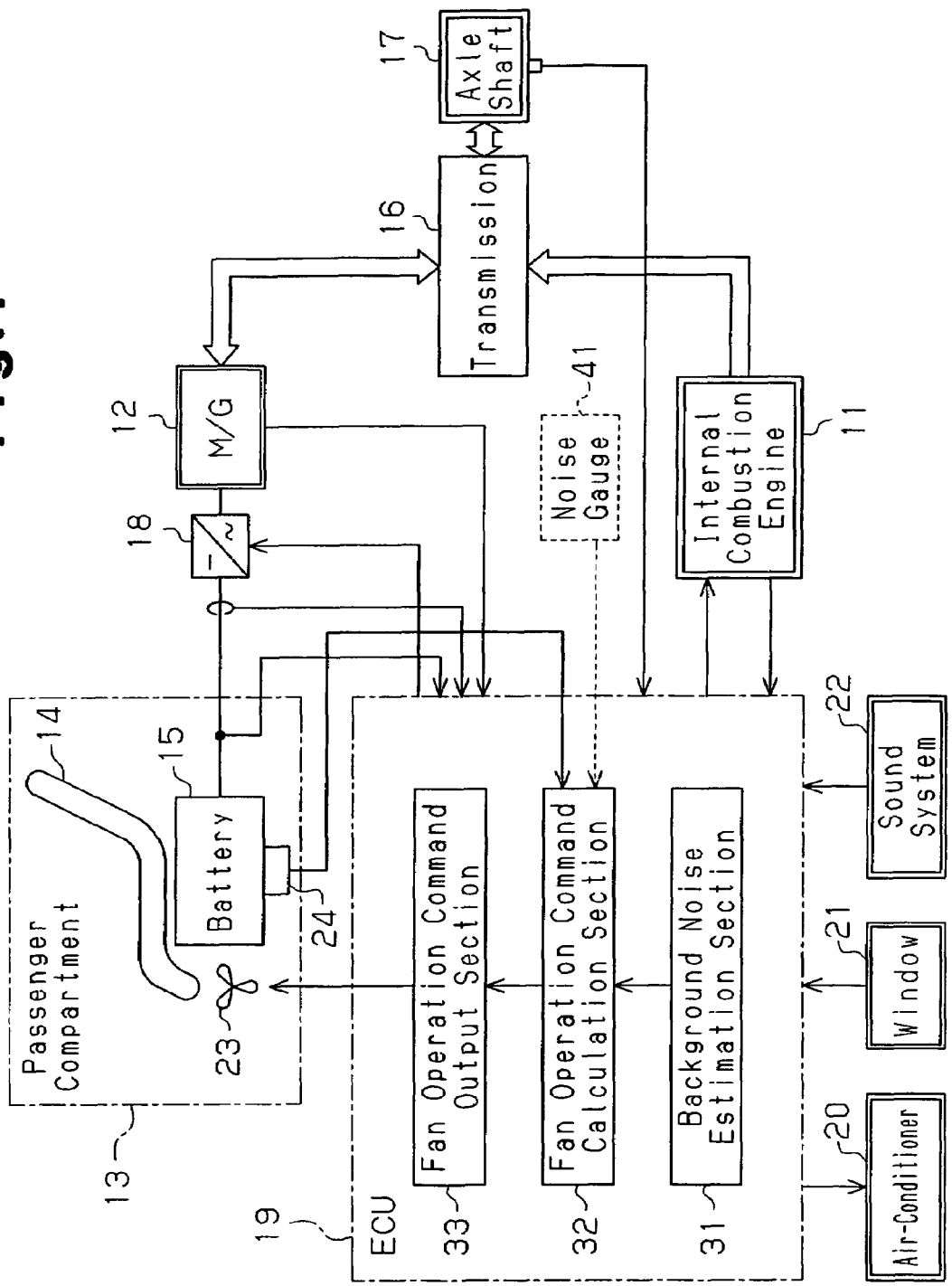
FIG. 1 is a block diagram showing a configuration of a fan control apparatus according to an embodiment of the present invention.

As shown in FIG. 1, the fan control apparatus according to this embodiment is applied to a vehicle using an internal combustion engine 11 and an electric motor 12 as drive sources, that is, a hybrid car. This embodiment uses a synchronous motor as the electric motor 12. This synchronous motor also functions as a generator, and therefore the electric motor 12 will be referred to as a motor generator (M/G) 12 hereinafter. A seat 14 is provided for a passenger in a passenger compartment 13. A battery 15 is disposed under this seat 14 and electric energy is exchanged between this battery 15 and M/G 12.

The vehicle moves when power generated by the internal combustion engine 11 or M/G 12 is transmitted to an axle shaft 17 via a transmission 16. When the M/G 12 functions as a drive source, an inverter 18 converts DC electric energy supplied from the vehicle-mounted battery 15 to AC and the M/G 12 generates power using the AC electric energy. When a regenerative brake is applied to the driving vehicle, the driving force of the axle shaft 17 is transmitted to the M/G 12 through the transmission 16. The M/G 12 generates AC electric energy based on the driving force of the axle shaft 17. The inverter 18 converts the AC electric energy generated by the M/G 12 to DC and charges the battery 15. Thus, the inverter 18 has the function of converting power from DC to AC and the function of converting power from AC to DC.

On the other hand, when the internal combustion engine 11 functions as the drive source, power generated at the internal combustion engine 11 is transmitted to the axle shaft 17 via the transmission 16 and at the same time drives the M/G 12 as required to generate electric energy. The inverter 18 converts AC electric energy generated by the M/G 12 to DC and charges the battery 15.

The vehicle is provided with an electronic control unit (ECU) 19 to control the internal combustion engine 11 and M/G 12. This ECU 19 is a controller made up of a microcomputer, etc., which provides the internal combustion engine 11 with a command regarding opening of a throttle valve (not shown) and a command regarding the amount of fuel injection and at the same time monitors the engine operating state such as the engine rotation speed through various sensors (not shown). Furthermore, the ECU 19 gives the inverter 18 a switching command for the above described power conversion and monitors the operating condition such as the rotation speed of the M/G 12 through various sensors (not shown). Furthermore, the ECU 19 calculates the vehicle speed based on the signal indicating the rotation speed of the axle shaft 17. Furthermore, the ECU 19 controls an air-conditioner 20 mounted on the vehicle and monitors the state (opening) of a window 21 and state of a sound system 22 (degree of volume adjustment).

When the vehicle is driving with power from the M/G 12, the battery 15 discharges. Furthermore, when the regenerative brake is applied, kinetic energy of the vehicle is converted to electric energy through the M/G 12, in which the electric energy is used to charge the battery 15. Therefore, when driving and stoppage of the vehicle are repeated, the battery 15 repeats charging/discharging. Since internal resistance exists in the battery 15, the battery 15 generates heat caused by current flow accompanying charging/discharging. As described above, the temperature rise of the battery 15 may cause shortening of the life of the battery 15 or degrades fuel efficiency of the internal combustion engine 11.

In order to prevent temperature rise of the battery 15, this vehicle is provided with a fan 23 to cool the battery 15 in the passenger compartment 13. To control the operating mode of this fan 23 according to the temperature of the battery 15, the vehicle is provided with a temperature detector for detecting the temperature of the battery 15, that is, a temperature sensor 24. Furthermore, to control the charging/discharging current of the battery 15 to a desired level, the vehicle is also provided with a sensor (not shown) for detecting a voltage and charging/discharging current of the battery 15. The ECU 19 calculates a command value necessary to cool the battery 15 based on the detected temperature, voltage and charging/discharging current and outputs the command value to the fan 23. As a result, the fan 23 rotates at a speed according to the command value, the air in the passenger compartment 13 is blown on the battery 15 and the battery 15 is cooled.

The operating sound of the fan 23 may constitute noise to passengers in the passenger compartment 13. For example, when the vehicle is parked and the operation of the internal combustion engine 11 is stopped, if no other noise source is present, the interior environment of the passenger compartment 13 is quiet. However, if the fan 23 is operating at this time, the operating sound increases relative to the quiet environment of the passenger compartment 13, which causes the operating sound to become offensive to the ear of the passengers. This noise becomes particularly noticeable when the fan 23 is disposed under the passenger's seat 14 as in the case of this embodiment.

On the other hand, the acoustic environment in the passenger compartment 13 is affected by not only the operating sound of the fan 23, but also the driving sound of the vehicle, operating sound of the internal combustion engine 11, operating sound of the M/G 12, operating sound of the air-conditioner 20, opening of the window 21 and volume of the sound system 22. For example, when the vehicle is driving at high speed, when the rotation speed of the internal combustion engine 11 or M/G 12 is high, when the air-conditioner 20 is operating with high load, when the window 21 is fully open, or when the sound system 22 is operating with high sound volume, noise in the passenger compartment 13 naturally increases. In such a case, even if the operating sound of the fan 23 is relatively large, sound other than the operating sound of the fan 23 is large, and therefore the operating sound of the fan 23 relatively decreases. Therefore, sensible noise of the fan 23 to the passengers of the vehicle is small.

Therefore, in order to reduce sensible noise with respect to this fan 23 and effectively cool the battery 15, this embodiment is designed to control the fan 23 as follows. Since this embodiment regards the operating sound of the fan 23 as an evaluation target, sound caused by all noise sources other than the fan 23 is treated as background noise. Vehicle components assumed to constitute possible sources of this background noise (causes for noise) are shown enclosed with a double-line rectangle in FIG. 1. That is, as shown in FIG. 1, this embodiment assumes the axle shaft 17 through which the vehicle speed is detected, internal combustion engine 11, M/G 12, air-conditioner 20, window 21 and sound system 22 as the background noise source (causes for background noise).

The above described ECU 19 is provided with a background noise estimation section 31, a fan operation command calculation section 32 and a fan operation command output section 33 for effectively cooling the battery 15 using the fan 23 according to background noise in the passenger compartment 13. These elements (31 to 33) show the functions executed by the ECU 19 according to a predetermined control program. The ECU 19 including these elements (31 to 33) controls the fan 23 according to the procedure shown in the flowchart in FIG. 2.

First, in step S201, the ECU 19 determines whether there is any request for special operation on the fan 23. This request for a special operation is made when the temperature of the battery 15 is recognized to be abnormal or when the fan 23 or other parts have trouble. When there is a request for a special operation, the ECU 19 goes to step S209 and calculates a command value according to the special operation as the command value corresponding to the fan 23. The process in this step S209 is defined as an abnormal process which is different from a normal process, which will be described later. For example, when the battery 15 is abnormally hot, a process such as operating the fan 23 irrespective of background noise is performed.

On the other hand, when there is no request for a special operation, the ECU 19 goes to step S202 and estimates the background noise level in the passenger compartment 13 caused by the aforementioned background noise source. The background noise level is estimated based on the command value given from the ECU 19 to each background noise source or status value of the background noise source detected by various sensors. More specifically, the level of the background noise in the passenger compartment 13 is estimated based on the vehicle speed obtained from the rotation speed of the axle shaft 17, rotation speed of the internal combustion engine 11, rotation speed of the M/G 12, command value corresponding to the air-conditioner 20, opening of the window 21 and degree of adjustment of sound volume of the sound system 22. With regard to the level of background noise, it is possible to estimate noise caused by each background noise source individually and determine the level of background noise comprehensively based on the estimation, for example. Furthermore, in estimating the level of background noise, it is preferable to consider relationships between a plurality of mutually affecting factors such as the relationship between the vehicle speed and opening of the window 21. With regard to the process of this step S202, the ECU 19 functions as the background noise estimation section 31.

Then, in steps S203 to S207, the ECU 19 calculates an operation command value for the fan 23 based on the estimated background noise level and temperature of the battery 15 detected by the temperature sensor 24. For the processes in these steps S203 to S207, the ECU 19 functions as the fan operation command calculation section 32. More specifically, in step S203, the fan operation command calculation section 32 determines whether the specified background noise level satisfies a predetermined first condition or not, that is, whether the background noise level is equal to or below a predetermined first threshold or not. When the background noise level satisfies the first condition, that is, equal to or below the first threshold, the fan operation command calculation section 32 goes to step S205a, sets the background noise level to "1" and stores the set background noise level in a memory (not shown) provided for the ECU 19. On the other hand, when the estimated background noise level does not satisfy the first condition, that is, the estimated background noise level is greater than the first threshold, the fan operation command calculation section 32 goes to step S204 and determines whether the background noise level satisfies a predetermined second condition or not, that is, whether the background noise level is equal to or below a second threshold which is greater than the first threshold.

When the background noise level satisfies the second condition, that is, the background noise level is equal to or below the second threshold, the fan operation command calculation section 32 goes to step S205b, sets the background noise level to "2" and stores the set background noise level in the above described memory. On the other hand, when the background noise level does not satisfy the second condition, that is, the background noise level is greater than the second threshold, the fan operation command calculation section 32 goes to step S205c, sets the background noise level to "3" and stores the set background noise level in the memory. A smaller value indicating the background noise level means that the environment in the passenger compartment 13 is quieter, while a larger value indicating the background noise level means that the background noise level in the passenger compartment 13 is high. Thus, executing processes in steps S203 to S205c, shows the estimated background noise level with any one of background noise levels in a plurality of stages (3 stages in this embodiment).

After step S205a, step S205b or step S205c, the fan operation command calculation section 32 sets the temperature level according to the temperature of the battery 15 detected by the temperature sensor 24 in step S206 and stores the set temperature level in the memory. The temperature level is set to any one of temperature levels in five stages "A" to "E" according to the detected temperature of the battery 15. That is, the temperature of the battery 15 is indicated by any one of temperature levels in a plurality of stages. The temperature level indicates that the temperature of the battery 15 increases in order of A, B, C, D and E. That is, the temperature level at "A" indicates that the temperature of the battery 15 is lowest and the temperature level at "E" indicates that the temperature of the battery 15 is highest. Next, in step S207, the fan operation command calculation section 32 calculates an operation command value for the fan 23 based on the background noise level and temperature level set above.

In step S208, the ECU 19 outputs the calculated command value to the fan 23. As a result, the fan 23 follows the command value or more specifically the fan 23 is controlled so as to operate at a rotation speed corresponding to the command value. In the process in this step S208, the ECU 19 functions as the fan operation command output section 33.

Figure 3:
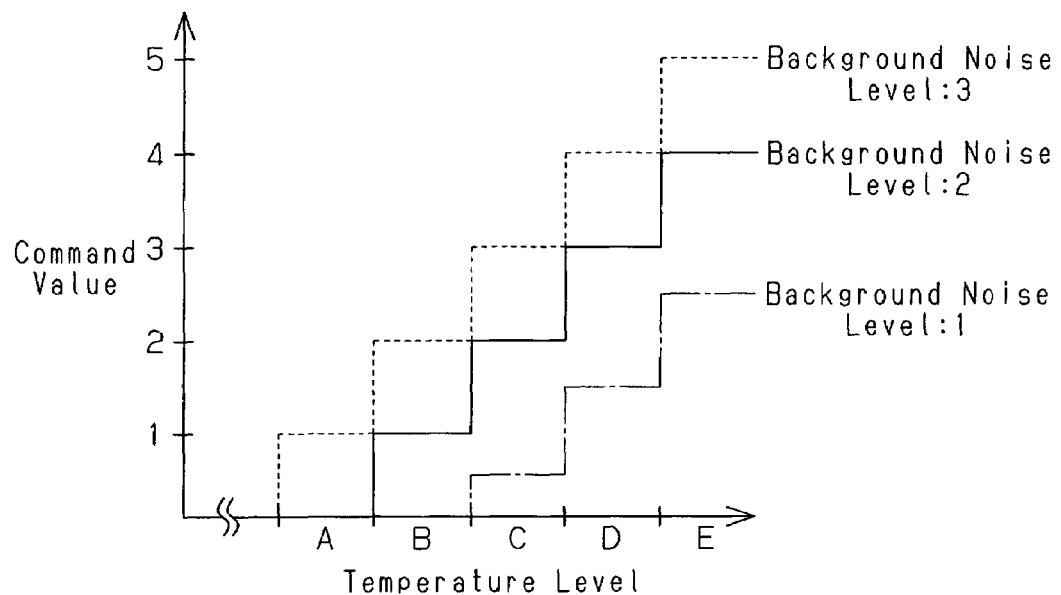
FIG. 3 is a graph illustrating an operation command value for the fan calculated in the fan controlling procedure in FIG. 2.

The command value calculated in step S207 is defined so as to have a characteristic as illustrated in FIG. 3. That is, as shown in FIG. 3, as the temperature level increases from "A" to "E" and as the background noise level increases from "1" to "3", the command value for the fan 23 increases. For example, when the background noise level is set to "1", as shown in single-dot dashed line in FIG. 3, the command value increases stepwise from "0"→"0"→"0.5"→"1.5"→"2.5" as the temperature level increases from "A" to "E". Furthermore, when the background noise level is set to "2", as shown in a solid line in FIG. 3, the command value increases stepwise from "0"→"1"→"2"→"3"→"4" as the temperature level increases from "A" to "E". Furthermore, when the background noise level is set to "3", as shown by the dotted line in FIG. 3, as the temperature level increases from "A" to "E", the command value increases stepwise from "1"→"2"→"3"→"4"→"5". The command value for the fan 23 is, for example, a voltage value itself, or a voltage whose duty ratio is controlled. As the command value increases (as the voltage or duty ratio increases), the rotation speed of the fan 23 increases.

Figure 4:
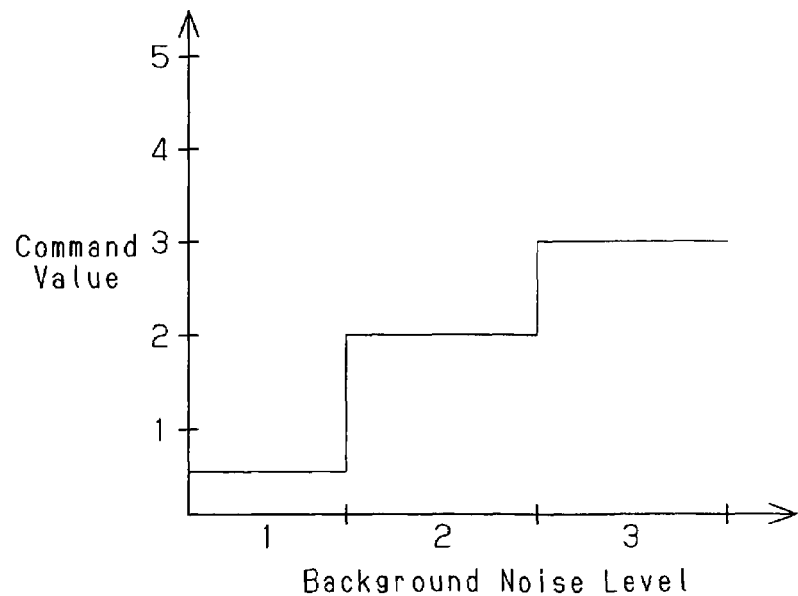
FIG. 4 is a graph illustrating a relationship between an operation command value for the fan and background noise level.

In this way, the command value for the fan 23 increases as the background noise level increases according to the temperature of the battery 15 at that time. FIG. 4 is a graph illustrating the relationship between the background noise level and command value for the fan 23 when the temperature level is set to "C". As shown in this graph, when the temperature level is set to "C", the command value increases stepwise from "0.5"→"2"→"3" as the background noise level increases from "1"→"2"→"3".

This embodiment explained so far has the following excellent advantages:

(1) The ECU 19 has the function of determining noise in the passenger compartment 13 and controlling the operating mode of the fan 23 according to the determined noise. That is, the ECU 19 determines the noise level in the passenger compartment 13 and calculates a command value for the fan 23 according to the determined noise level. As the noise level in the passenger compartment 13 increases, a greater command value is calculated so as to rotate the fan 23 at a higher speed. When the noise level in the passenger compartment 13 is lower, a smaller command value is calculated so as to rotate the fan 23 at a lower speed. That is, the operating mode of the fan 23 is controlled according to the noise level in the passenger compartment 13 so that the operating sound of the fan 23 becomes smaller when the acoustic environment in the passenger compartment 13 is estimated to be quiet, and the battery 15 is effectively cooled when the noise level in the passenger compartment 13 is estimated to be large. As a result, it is possible to reduce sensible noise of the fan 23 to passengers in the passenger compartment 13 and effectively cool the battery 15 as well.

(2) In controlling the fan 23, noise in the passenger compartment 13 to be estimated is noise other than the operating sound of the fan 23, that is, background noise for the operating sound of the fan 23. The level of the background noise is estimated based on the content of an operation command given to each of vehicle components that are estimated as causes for background noise or the operating status of each vehicle component. For this reason, the level of background noise is estimated accurately and the fan 23 is operated at an exact rotation speed according to the level of the estimated background noise level. Furthermore, it is also possible to designate only the vehicle components selected beforehand as background noise factors as estimation targets of background noise levels. For example, noise factors which should not be handled as background noise targets, such as conversation between passengers, can be purposely excluded from the estimation targets.

(3) The battery 15 is cooled using the air in the passenger compartment 13. For this reason, when the air in the passenger compartment 13 is kept to an appropriate temperature by the air-conditioner 20, the battery 15 is cooled more stably compared to the case where the battery 15 is cooled using the air outside the passenger compartment 13, which drastically changes.

(4) The ECU 19 calculates a command value for the fan 23 based on not only noise in the passenger compartment 13 but also the temperature in the battery 15. For this reason, while sensible noise of the fan 23 to passengers in the passenger compartment 13 is reduced, it is possible to cool the battery 15 more adequately according to the temperature. Since an abnormal temperature rise of the battery 15 can be prevented, it is possible to prevent the life of the battery 15 from being shortened. Furthermore, prevention of temperature rise of the battery 15 leads to a decrease in load on the internal combustion engine 11 and improvement of fuel efficiency of the internal combustion engine 11.

(5) Causes for background noise can be the vehicle speed (that is, the vehicle itself), the internal combustion engine 11, the M/G 12, the air-conditioner 20, the window 21 and the sound system 22. These factors for background noise generally reflect factors for background noise in the passenger compartment 13 of the hybrid car. For this reason, the background noise level in the passenger compartment 13 of the hybrid car is adequately estimated and the operation of the fan 23 is controlled in an appropriate manner.

(6) In a vehicle according to this embodiment, the battery 15 is disposed under the seat 14 and the operating sound of the fan 23 is easily sensed by the ears of passengers. Applying the fan control according to this embodiment as described above to such a vehicle is further effective in reducing sensible noise of the fan 23 to the passengers in the passenger compartment 13.

Another embodiment of the present invention will be explained centered on differences from the embodiment in FIG. 1 to FIG. 4 according to FIG. 5 and FIG. 6.

In the embodiment in FIG. 1 to FIG. 4, the amount of operation of the fan 23, that is, the rotation speed is changed according to the background noise level in the passenger compartment 13 and temperature level of the battery 15. However, when the operating sound of the fan 23 drastically changes due to change of rotation speed of the fan 23, passengers may feel a sense of discomfort. However, while a drastic increase of the operating sound of the fan 23 causes passengers to feel a noticeable sense of discomfort, a decrease of the operating sound of the fan 23 is less likely to cause passengers to feel a sense of discomfort no matter how drastic the decrease may be.

Figure 2:
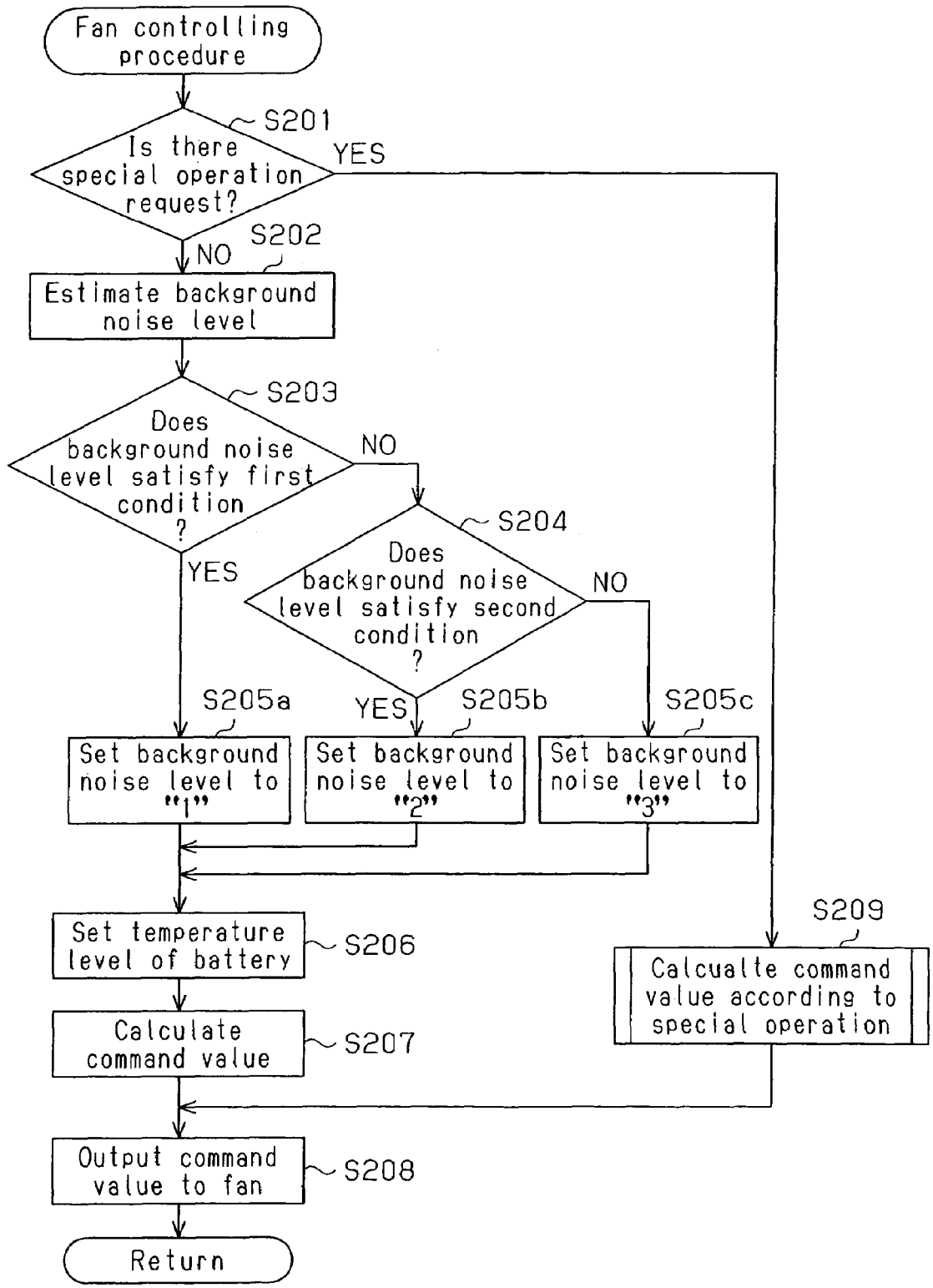
FIG. 2 is a flowchart showing a fan controlling procedure executed by the fan control apparatus shown in FIG. 1.

Thus, this embodiment applies a filtering process to the operation command value calculated according to the fan controlling procedure in FIG. 2 for slowing the variation of the operation command value. Hereinafter, the operation command value calculated in the fan controlling procedure in FIG. 2 will be referred to as a target operation command value St and the operation command value after the filtering process will be referred to as a final operation command value Sfin.

Figure 5:
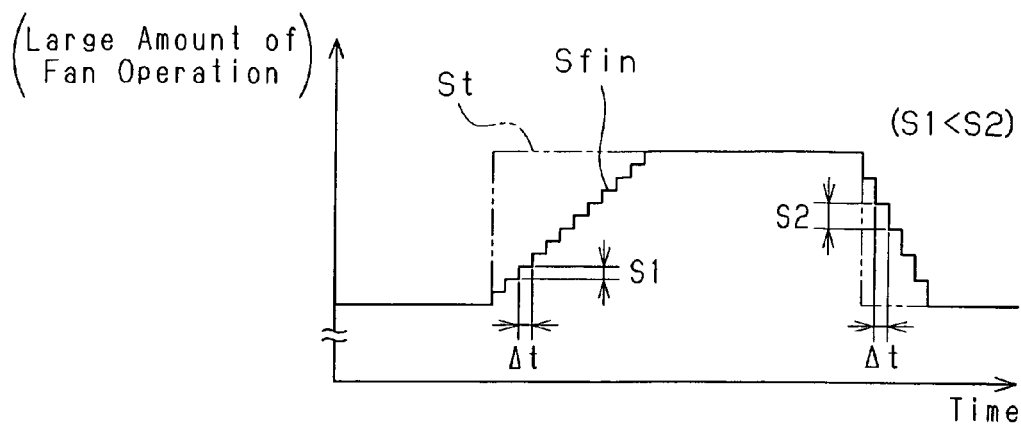
FIG. 5 is a time chart showing a fan control procedure in another embodiment of the present invention.

In the filtering process, as shown in FIG. 5, the final operation command value Sfin input to the fan 23 with respect to one change of the target operation command value St is changed stepwise in a plurality of stages. When the target operation command value St is increased so as to increase the amount of operation of the fan 23, the final operation command value Sfin is increased by a predetermined amount of increase S1 per predetermined unit time Δt. Furthermore, when the target operation command value St is decreased so as to reduce the amount of operation of the fan 23, the final operation command value Sfin is decreased by a predetermined amount of decrease S2 per predetermined unit time Δt. The amount of increase S1 is set to a value sufficiently small relative to the amount of decrease S2. For this reason, when the amount of operation of the fan 23 is increased, the final operation command value Sfin is slowly changed compared to when the amount of operation is decreased.

Figure 6:
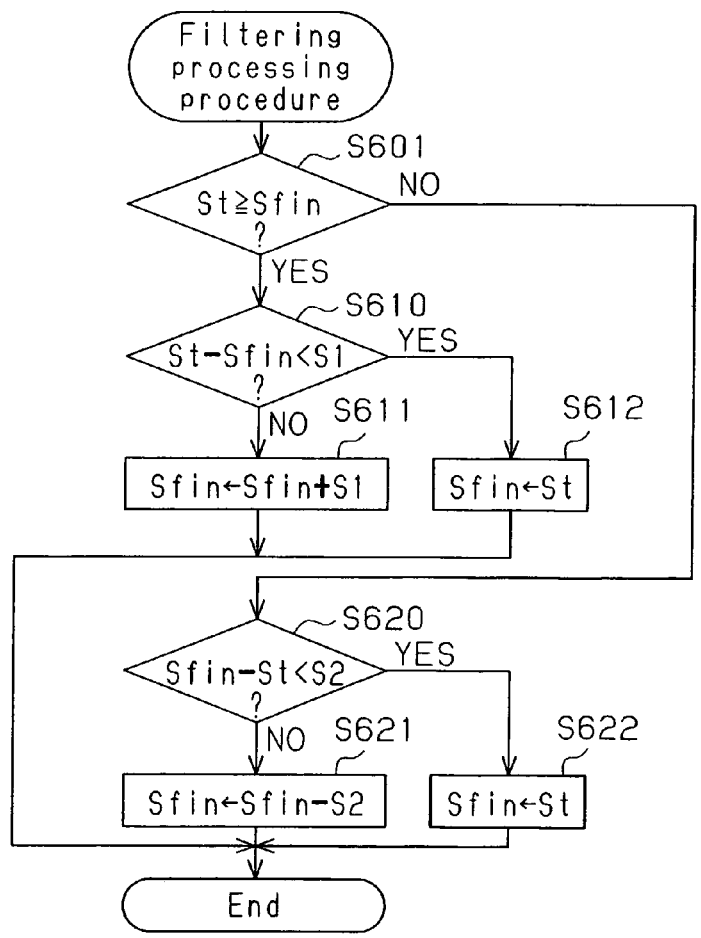
FIG. 6 is a flowchart showing a filtering processing procedure applicable to another embodiment in FIG. 5.

FIG. 6 is a flowchart showing the above described filtering processing procedure. The filtering processing procedure is performed by the ECU 19 following the fan controlling procedure in FIG. 2.

When this filtering processing procedure is started, first in step S601, the ECU 19 determines whether the target operation command value St is equal to or greater than the current final operation command value Sfin or not.

When the decision result in step S601 is positive, the ECU 19 goes to step S610 and determines whether the difference (St−Sfin) between the target operation command value St and final operation command value Sfin is smaller than the above described amount of increase Si or not. If this difference (St−Sfin) is equal to or greater than the amount of increase Si, the ECU 19 goes to step S611, sets the result of adding the amount of increase Si to the current final operation command value Sfin as a new final operation command value Sfin, and ends this process. Furthermore, when the difference (St−Sfin) is smaller than the amount of increase S1, the ECU 19 goes to step S612, sets the current target operation command value St as the final operation command value Sfin and ends this process.

On the other hand, when the target operation command value St is smaller than the current final operation command value Sfin in step S601, the ECU 19 goes to step S620 and determines whether the difference (Sfin−St) between the final operation command value Sfin and target operation command value St is smaller than the amount of decrease S2 or not. If the difference (Sfin−St) is equal to or greater than the amount of decrease S2, the ECU 19 goes to step S621, sets the result of subtracting the amount of decrease S2 from the current final operation command value Sfin as a new final operation command value Sfin and ends this process. On the other hand, if the difference (Sfin−St) is smaller than the amount of decrease S2, the ECU 19 goes to step S622, sets the current target operation command value St as the final operation command value Sfin and ends this process.

This embodiment explained so far has the following advantages in addition to the advantages of the embodiment in FIG. 1 to FIG. 4.

(7) The operation command value for the fan 23 is changed gradually when the amount of operation of the fan 23 is changed. For this reason, the amount of operation of the fan 23, that is, the rotation speed slowly changes without changing drastically. A gradual change of the rotation speed of the fan 23 causes a gradual change in the operating sound of the fan 23. As a result, it is possible to reduce the sense of discomfort that the change in operating sound of the fan 23 causes to the passengers.

(8) The rate of change in the amount of operation of the fan 23 is differentiated when the amount of operation of the fan 23 is increased and decreased. More specifically, when the amount of operation of the fan 23 is increased, the rate of change in the amount of operation is lower than when the amount of operation of the fan 23 is decreased. For this reason, when the amount of operation of the fan 23 is increased, the drastic increase in the operating sound is suppressed and when the amount of operation of the fan 23 is decreased, the operating sound is speedily decreased. As a result, it is possible to effectively reduce the sense of discomfort that the operating sound of the fan 23 causes to the passengers.

The above described embodiments may be modified as follows.

In the filtering processing procedure shown in FIG. 6, the final operation command value Sfin is changed stepwise. However, it is possible to gradually change the final operation command value Sfin in any mode, for example, continuously change the final operation command value Sfin or change the change rate of the final operation command value Sfin according to various conditions, etc.

The above described embodiments have enumerated the axle shaft 17 through which the vehicle speed is detected, internal combustion engine 11, M/G 12, air-conditioner 20, window 21 and sound system 22 as the vehicle components which can be considered as causes for background noise, but the present invention is not necessarily limited to these vehicle components. All these vehicle components need not be assumed as causes for background noise. It is also possible to assume vehicle components other than these vehicle components, for example, a wiper for wiping away raindrops, an air cleaner provided in the passenger compartment, etc., as causes for background noise.

With respect to each of vehicle components to be estimated as causes for background noise, whether the operation command value for each element should be used to estimate the background noise level or the operating condition value of each element should be used to estimate the background noise level can be selected as appropriate within the range in which the background noise level can be accurately estimated.

The location of the battery 15 is not limited to under the seat 14, but may also be other than under the seat 14 in the passenger compartment 13 or outside the passenger compartment 13.

Cooling of the battery 15 is not limited to cooling using the air in the passenger compartment 13, but may also be performed using air outside the passenger compartment 13. The fan 23 may be placed inside the passenger compartment 13 or may also be placed outside the passenger compartment 13.

The battery to be cooled by using the fan 23 is not limited to the battery 15 which supplies power to the electric motor 12 that functions as a drive source of the vehicle, but may also be any battery mounted on the vehicle.

In the fan controlling procedure in FIG. 2, the temperature of the battery 15 may be expressed with temperature levels of a plurality of stages other than five stages or may be treated as a continuous numerical value instead of temperature levels in a plurality of stages. Likewise, the background noise levels in the passenger compartment 13 may also be expressed with levels in a plurality of steps other than three stages. The background noise levels may also be treated as a continuous numerical value instead of levels in a plurality of stages. Furthermore, operation command values corresponding to the fan 23 are not limited to values which vary stepwise and may also be a value which varies continuously.

Control of the fan 23 based on the temperature level may be performed independently of control of the fan 23 based on the background noise level. Furthermore, instead of control of the fan 23 based on the temperature level, it is also possible to perform control of only the fan 23 based on the background noise level.

It is possible to reduce a command value for the fan 23 to an extent that the battery 15 is not adversely influenced if the passenger compartment 13 is in a quiet environment even if the detected temperature of the battery 15 is high. Thus, the fan 23 may be controlled further considering temporal conditions in addition to the temperature level and background noise level.

In addition to the background noise level estimated with a noise gauge 41 provided on the vehicle as shown with a dotted line in FIG. 1, it is also possible to determine the noise level in the passenger compartment 13 by further taking into account the actual noise level directly measured using the noise gauge 41. Instead of estimating the background noise level, it is possible to control the fan 23 only based on the actual noise level as directly measured using the noise gauge 41. In this case, the noise gauge 41 functions as the determining means for determining the noise level in the passenger compartment 13. Using the directly measured actual noise level, it is possible to control the fan 23 by reflecting the acoustic environment in the passenger compartment 13 more faithfully. The noise gauge 41 may be placed inside the passenger compartment 13 or may also be placed outside the passenger compartment 13.

It is also possible to provide a sound absorbing member or sound insulator as appropriate to reduce the operating sound of the fan 23 or increase the cross section of the passage for the cooling air to be sent to the battery 15.

The present invention is not limited to a hybrid car provided with an internal combustion engine 11 and M/G 12, but is also applicable to an electric car. Such an electric car may be provided with a secondary battery or fuel cell as the battery and a motor operating based on power of the battery as the drive source.

The invention claimed is:

1. A method of controlling a fan for cooling a vehicle-mounted battery, said vehicle being provided with a passenger compartment for passengers and an electric motor which functions as a drive source of the vehicle, said control method comprising:
    determining noise level in said passenger compartment; and
    outputting a command value to control a rotational speed of said fan according to the determined noise level in the passenger compartment so that the fan is rotated at a higher speed as the determined noise level increases, wherein said control of the rotational speed of the fan includes differentiating a rate of change of the rotational speed of the fan so that the rate of change is lower when the rotational speed is increased than when decreased.

2. The control method according to claim 1, wherein said determining noise level in said passenger compartment includes estimating background noise level due to noise other than noise generated from said fan.

3. The control method according to claim 2, wherein said background noise level is estimated based on the content of an operation command corresponding to at least one vehicle component.

4. The control method according to claim 2, wherein said background noise level is estimated based on the condition of at least one vehicle component.

5. The control method according to claim 2, wherein noise level in said passenger compartment is determined based on estimated background noise level in the passenger compartment and an actually measured noise level in the passenger compartment.

6. The control method according to claim 1, wherein said determining noise level in the passenger compartment includes actually measuring the noise level in the passenger compartment.

7. The control method according to claim 1, further comprising detecting the temperature of said battery, wherein the rotation state of said fan is controlled according to the detected battery temperature.

8. An apparatus for controlling a fan for cooling a vehicle-mounted battery, said vehicle being provided with a passenger compartment for passengers and an electric motor which functions as a drive source of the vehicle, said control apparatus comprising:
    determining means for determining noise level in said passenger compartment; and
    controlling means for outputting a command value to control a rotational speed of said fan according to the determined noise level in the passenger compartment so that the fan is rotated at a higher speed as the determined noise level increases, wherein said controlling means includes differentiating a rate of change of the rotational speed of the fan so that the rate of change is lower when the rotational speed is increased than when decreased.

9. The control apparatus according to claim 8, wherein said determining means estimates background noise level which is noise other than noise generated from said fan and determines noise level in said passenger compartment based on the estimated background noise level.

10. The control apparatus according to claim 9, wherein said determining means estimates background noise level in said passenger compartment based on a content of an operation command corresponding to at least one vehicle component.

11. The control apparatus according to claim 9, wherein said determining means estimates background noise level in said passenger compartment based on a condition of vehicle components that can be causes for said background noise level.

12. The control apparatus according to claim 10, wherein said at least one vehicle component includes at least one of said electric motor, air-conditioner, window, sound system, and a member through which vehicle speed can be detected.

13. The control apparatus according to claim 10, wherein said vehicle is provided with an internal combustion engine which functions as a drive source in addition to said electric motor and said vehicle components include at least one, said electric motor, said internal combustion engine, air-conditioner, window, sound system, and a member through which vehicle speed can be detected.

14. The control apparatus according to claim 9, further comprising a noise gauge for directly measuring noise level in said passenger compartment, wherein said determining means determines noise level in said passenger compartment based on the estimated background noise level in the passenger compartment and the measured noise level in the passenger compartment.

15. The control apparatus according to claim 8, wherein said determining means comprises a noise gauge for directly measuring noise level in said passenger compartment and said controlling means controls the rotation state of said fan based on the measured noise level in the passenger compartment.

16. The control apparatus according to claim 8, wherein said fan blows the air in said passenger compartment on the battery to cool said battery.

17. The control apparatus according to claim 8, wherein said battery is disposed under a seat provided in said passenger compartment.

18. The control apparatus according to claim 8, further comprising a temperature detector which detects the temperature of said battery, wherein said controlling means controls the rotation state of said fan according to the determined noise level in the passenger compartment and the detected temperature of the battery.

19. An apparatus for controlling a fan for cooling a vehicle-mounted battery, said vehicle being provided with a passenger compartment for passengers and an electric motor which functions as a drive source of the vehicle, said control apparatus comprising:
    determining logic for determining noise level in said passenger compartment; and
    controlling logic for outputting a command value to control a rotational speed of said fan according to the determined noise level in the passenger compartment so that the fan is rotated at a higher speed as the determined noise level increases, wherein said controlling logic differentiates a rate of change of the rotational speed of the fan so that the rate of change is lower when the rotational speed is increased than when decreased.

* * * * *